United States Patent
Smith et al.

(10) Patent No.: US 6,801,084 B2
(45) Date of Patent: Oct. 5, 2004

(54) TRANSIMPEDANCE AMPLIFIER AND CIRCUIT INCLUDING THE SAME

(75) Inventors: Robert M. Smith, Scottsdale, AZ (US); C. Phillip McClay, Fountain Hills, AZ (US); Robert T. Carroll, Andover, MA (US)

(73) Assignee: Primarion, Inc., Tempe, AZ (US)

(*) Notice: Subject to any disclaimer, the term of this patent is extended or adjusted under 35 U.S.C. 154(b) by 32 days.

(21) Appl. No.: 10/359,155

(22) Filed: Feb. 6, 2003

(65) Prior Publication Data

US 2003/0151458 A1 Aug. 14, 2003

Related U.S. Application Data

(60) Provisional application No. 60/356,808, filed on Feb. 13, 2002, provisional application No. 60/407,494, filed on Aug. 30, 2002, provisional application No. 60/407,496, filed on Aug. 30, 2002, provisional application No. 60/407,495, filed on Aug. 30, 2002, and provisional application No. 60/407,493, filed on Aug. 30, 2002.

(51) Int. Cl.$^7$ ............................................. H03F 1/36
(52) U.S. Cl. ......................... 330/98; 330/310; 330/311
(58) Field of Search ........................ 330/98, 133, 150, 330/310, 311

(56) References Cited

U.S. PATENT DOCUMENTS

| | | | | |
|---|---|---|---|---|
| 3,668,539 A | * | 6/1972 | Healey | 330/311 |
| 4,511,857 A | * | 4/1985 | Gunderson | 330/311 |
| 5,933,057 A | * | 8/1999 | Tchamov et al. | 330/311 |
| 6,069,534 A | * | 5/2000 | Kobayashi | 330/308 |

* cited by examiner

Primary Examiner—Khanh Van Nguyen
(74) Attorney, Agent, or Firm—Theodore E. Galanthay

(57) ABSTRACT

Disclosed is a four stage transimpedance amplifier having a grounded base transistor preamplifier input stage, a common emitter voltage amplifier stage, and an amplifier stage having a common collector transistor, an output buffer stage, and a bias circuit coupled to the preamplifier stage to prevent the grounded base transistor from going into saturation.

17 Claims, 2 Drawing Sheets

TRANSIMPEDANCE AMPLIFIER AND CIRCUIT INCLUDING THE SAME

CROSS REFERENCE TO RELATED APPLICATIONS

This patent application claims priority to, and the benefit of, U.S. provisional patent applications identified as follows: Provisional Application Serial No. 60/356,808, entitled SELF-BIASING. TRANSIMPEDANCE AMPLIFIER, filed Feb. 13, 2002; Provisional Application Serial No. 60/407, 494, entitled TRANSIMPEDANCE AMPLIFIER AND CIRCUIT INCLUDING THE SAME Filed Aug. 30, 2002; Provisional Application Serial No. 60/407,496, entitled SYSTEM AND CIRCUIT FOR A MULTI-CHANNEL OPTOELECTRONIC DEVICE DRIVER Filed Aug. 30, 2002; Provisional Application Serial No. 60/407,495 entitled SYSTEM AND CIRCUIT FOR AN OPTOELECTRONIC DEVICE DRIVER Filed Aug. 30, 2002; Provisional Application Serial No. 60/407,493, entitled SYSTEM FOR TRANSMITTING OPTOELECTRONIC INFORMATION Filed Aug. 30, 2002.

FIELD OF THE INVENTION

The present invention generally relates to circuits for receiving and processing optoelectronic information. More particularly, the invention relates to circuits for detecting and amplifying a signal received from a light detecting device.

BACKGROUND OF THE INVENTION

As the rate of data transfer between microelectronic devices increases, use of typical electrical bus schemes to transmit information becomes increasingly problematic. In particular, as the amount of information transfer increases, an amount of input/output power required to transmit information between devices and consequently an amount of electronic noise associated with the transmission increase.

Another problem associated with transmission of electrical signals using traditional electrical bus systems is that signal degradation increases as the rate of the transmitted signal increases. For example, when signals are transmitted at a rate of about 5 GHz using FR-4 substrate material, the signal suffers about a 60 dB loss across 10 cm. This loss can cause rise time degradation and amplitude loss for the signals as the higher order harmonics are filtered out. Accordingly, improved apparatus and systems for transmitting information between a plurality of microelectronic devices is desired. For the above reasons, although the majority of signal processing is done in the electrical domain, it has become highly advantageous to utilize optical communications to interconnect microelectronic devices.

In order to obtain the benefits of optical communications, optical signals must be detected, converted to electrical signals and vice versa. For this purpose, various optoelectronic devices have been developed and are available in the market place as individual devices as well as arrays. However, specialized circuits are needed to advantageously utilize this technology. For example, photo detectors provide low level current output signals that must be amplified and converted to voltage signals. Accordingly, there is a need for improved amplifiers to accept such low level currents and provide amplified and converted voltage signals. Moreover, there is a need for such an improved amplifier to provide robust operation over a wide range of ambient temperature, power supply voltage, and process variations.

SUMMARY OF THE INVENTION

The present invention provides improved circuits and techniques for detecting, amplifying and processing high speed signals received from an optical sensor. More particularly, low level electrical signals are converted to amplified voltage signals.

In accordance with one aspect of the invention, an improved transimpedance amplifier (TIA) suitable for converting current into voltage is provided. The TIA's principal function is to interface a photo detector to an electronic system for applications such as data communications or other optical signal processing.

In accordance with the disclosed embodiments, the TIA of this invention embodies four stages: a common-base input preamplifier stage, a common-emitter voltage amplifier stage, common-collector isolation amplifier stage, an output buffer stage and a biasing circuit connected the base of the grounded base transistor in the input preamplifier stage. The described embodiments can be implemented in bipolar junction transistor (BJT), heterojunction bipolar transistor (HBT), MOSFET, CMOS, or any other complementary transistor technology. The details of those processes are well known to those skilled in the semiconductor arts and are not described in detail herein.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

Those skilled in the art will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. Further, it should be noted that while various components may be suitably coupled or connected to other components within exemplary circuits, such connections and couplings can be realized by direct connection between components, or by connection through other components and devices located therebetween.

The present invention generally relates to circuits for detecting, amplifying and transmitting optoelectronic information. More particularly, the invention relates to amplifiers and circuits for transmitting information received from a light detecting device.

Figure 1:
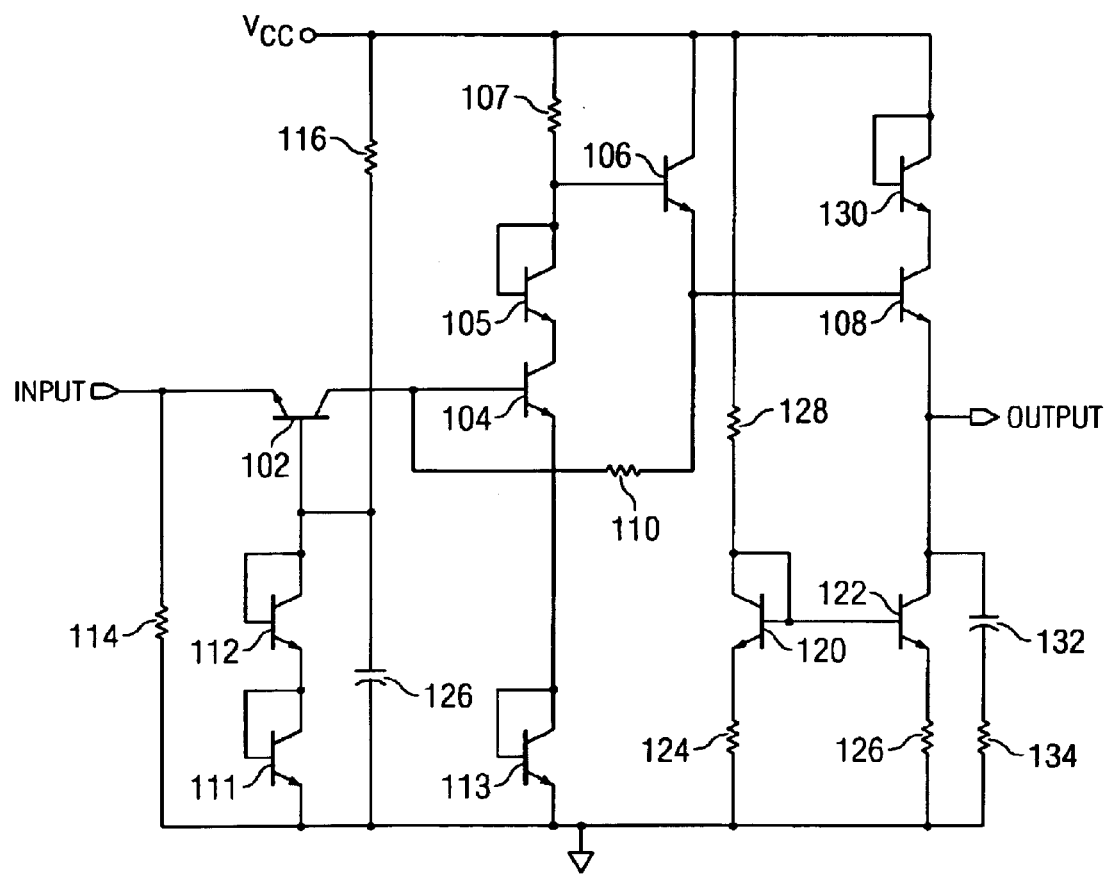
FIG. 1 is one embodiment of a transimpedance amplifier, in accordance with the present invention.

FIG. 1. illustrates a circuit 100 suitable for amplifying signals received from an optoelectronic device such as a photo detector or the like. Photo detectors devices such as reversed-biased pn junction diodes, p-i-n diodes, metalsemiconductor-metal (MSM) detectors, resonant cavity enhanced detectors, liquid crystal displays, or the like and can be discrete components or assembled in a one dimensional (1-D) or two-dimensional (2-D) array.

Circuit 100 is conveniently described as a transimpedance amplifier that includes four stages, as follows: a common base input pre-amplifier 102, a common emitter voltage amplifier 104, a common collector amplifier 106, and an output buffer stage 108. Circuit 100 may be formed using, for example, bipolar junction transistor (BJT), heterojunction bipolar transistor (HBT), MOSFET, CMOS, any other complementary transistor technology, or the like. In the illustrated example, bipolar transistor technology is shown.

Common-base (grounded base) transistor 102 has its emitter coupled to the INPUT where it receives a low level current provided by a photo detector. Common emitter transistor 104 has its base region coupled to the collector of transistor 102. Common collector transistor 106 has its base coupled to the collector of transistor 104 by diode 105. The output buffer amplifier stage formed by common collector output transistor 108 provides the OUTPUT at its emitter and has its base coupled to the collector of common-emitter transistor 104 by the series connection of diode 105 and the base-emitter junction of common collector transistor 106. A biasing circuit, i.e. diode connected transistors 111 and 112, is coupled to grounded base transistor 102, providing a bias voltage that is at least one diode voltage higher than the voltage at the emitter of the grounded base transistor 102. Diode voltages (the forward diode voltage drop of a diode) also known as diode voltage drops are known to be in the range of 0.7 volts, varying depending on the particular implementation.

The common-base amplifier, i.e. transistor 102 isolates an input photocurrent provided by a photo detector (not shown). This photocurrent is transmitted from the emitter of grounded base transistor 102 to its collector, and then converted to a voltage by the transresistance 110. Transresistance 110 is connected in a negative feedback path around a common-emitter amplifier including common-emitter connected transistor 104 connected to diode 105; which in turn is connected to the base of common collector transistor 106. The base of 106 is also connected to resistive load 107. The feedback path then passes through (is buffered by) a common-collector amplifier 106. The common-base amplifier 102 is biased at its base by the two diode-connected transistors 111 and 112. Accordingly, the input of the TIA (emitter of 102) is biased at one diode voltage, i.e. $1V_{be}$ above ground. Assuming that the transistors 104 and 113 are biased ON (as later shown in the description of the common-emitter amplifier 104), the collector of transistor 102 is at a voltage potential of approximately $2V_{be}$. Therefore, the collector-to-emitter voltage of transistor is fixed at $\sim 1V_{be}$ and cannot go into saturation. The biasing diode connected transistors 111 and 112 are biased themselves through resistor 116 to the voltage supply Vcc. AC-ground at the base of transistor 102 is provided by capacitor 126. Resistor 114 biases the common-base amplifier 102 at a current level of one voltage drop divided by the resistance value (R8) of resistor 114, i.e. $\sim 1V_{be}/R8$. In practice resistor 114 also provides an AC-blocking function since its resistance value is much greater than the input resistance presented by the emitter of grounded base transistor 102.

The common-emitter amplifier 104 has its input (base of 104) biased at $\sim 2V_{be}$. As described in the previous paragraph, the collector current of transistor 102 is set at $\sim 1V_{be}/R8$. Since negligible current flows into the base of common emitter transistor 104, this current flows from the transresistor 110 (having a resistance value of R6) and therefore the voltage potential at the emitter of common collector transistor 106 is approximately $2V_{be}+(1V_{be}/R8 \times R6)$. This current in turn also biases the common-collector amplifier 106. Since transistor 106 is on, the voltage at its base is $$2V_{be} + \left(\frac{1V_{be}}{R_8} \times R_6\right) + 1V_{be}$$

and the potential difference between the voltage supply Vcc and this voltage causes a current to flow through resistor 107 as determined by the resistance of resistor 107, flowing into the collectors of series connected transistors 105, 104 and 113, thereby insuring that these transistors are biased ON. Hence, the transistors of this circuit are biased independent of their individual transistor characteristics and governed only by the power supply voltage Vcc and the values of resistors 107, 110 and 114. Diode-connected transistor 105 serves only to limit the collector-emitter voltage of common emitter transistor 104.

The voltage at the emitter of common collector transistor 106 is buffered using common-collector amplifier 101, whose output (emitter of 101) is the OUTPUT of the TIA circuit 100 and is suitable for interfacing to subsequent electronic circuits. Transistor 108 can be biased in various ways. For example, as shown in FIG. 1, there is depicted a Widler current source formed by transistors 120 and 122 with resistors 124, 126, and 128. Diode connected transistor 130 serves only to limit the collector-emitter voltage of 108. Capacitor 132 and resistor 134 depict an equivalent load representing subsequent electronic circuits.

With circuit 100, photocurrent can be either pushed or pulled from the emitter of 102. In other words, this topology is suitable for common-anode or common-cathode photodetectors. Furthermore, this circuit can also be operated from negative or split voltage supplies provided that the voltage potential is decreasing from the node labeled Vcc to the node labeled ground. The common-base amplifier 102 also effectively isolates the photodiode capacitance from the frequency response of the TIA. Circuit 100 provides robust operation over a wide range of ambient temperature, power supply voltage, and process variations.

Figure 2:
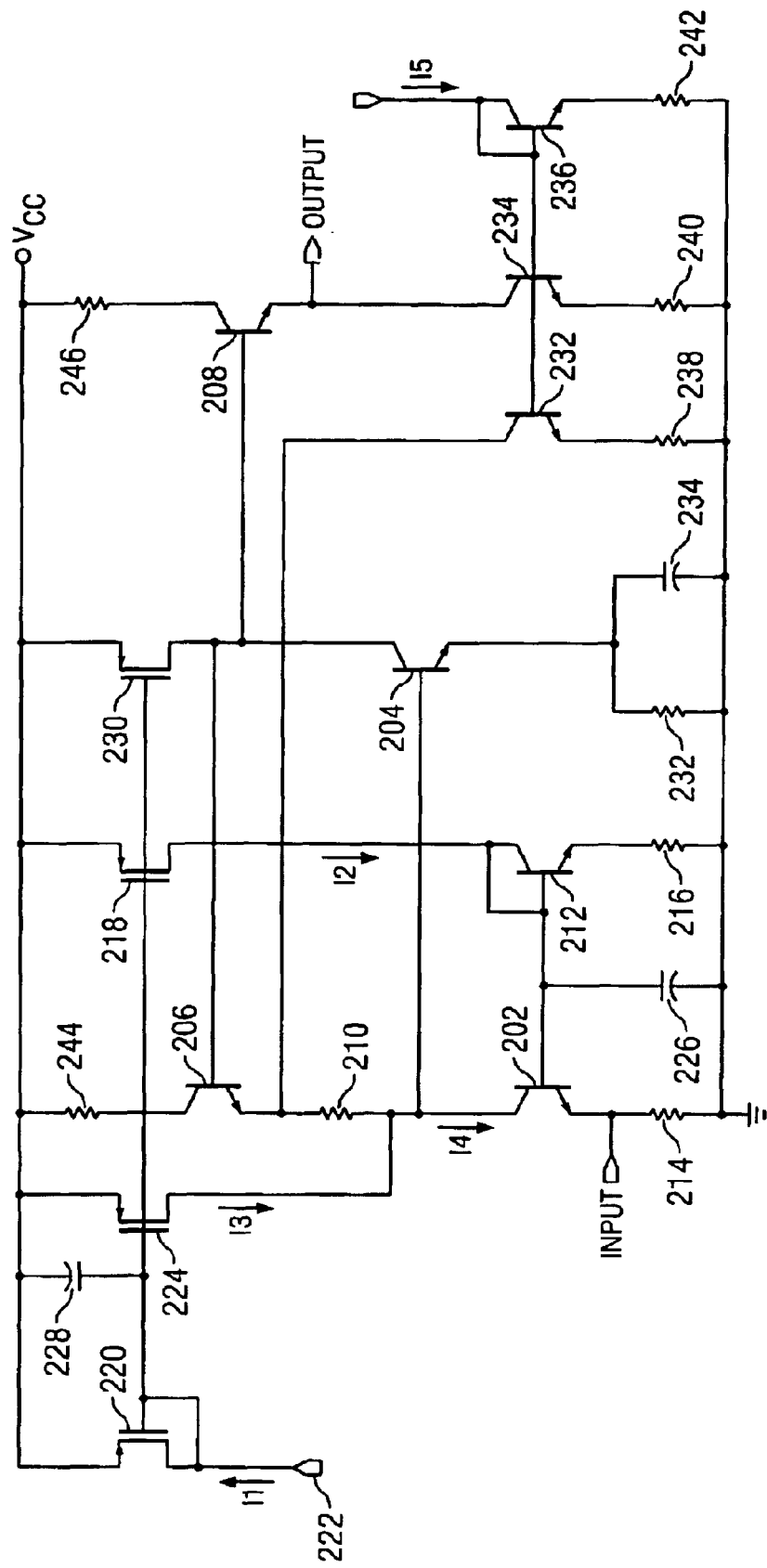
FIG. 2 is another embodiment of a transimpedance amplifier in accordance with the present invention.

FIG. 2 illustrates another embodiment of a four-stage transimpedance amplifier. The illustrated circuit 200 is particularly adapted to convert current received at the INPUT, e.g. from a photo detector and converting it to a voltage for electronic processing at the OUTPUT. Circuit 200 provides robust operation over a wide range of ambient temperatures, power supply voltages, and process variations.

Circuit 200 includes four stages: a common base input pre-amplifier 202, a common emitter voltage amplifier 204, a common collector isolation amplifier 206, and an output buffer stage 208. Circuit 200 may be formed using, for example, bipolar junction transistor (BJT), heterojunction bipolar transistor (HBT), MOSFET, CMOS, any other complementary transistor technology, or the like.

Common-base (grounded base) transistor 202 has its emitter coupled to the INPUT. Common emitter transistor 204 has its base region coupled to the collector of transistor 202. Common collector transistor 206 has its base coupled to the collector of transistor 204. The output buffer amplifier stage is formed by common collector output transistor 208; which provides the OUTPUT at its emitter and has its base coupled to the collector of common-emitter transistor 204. A biasing circuit (including a current mirror 212 described in greater detail herein below) is coupled to grounded base transistor 202, providing a bias voltage that prevents the grounded base transistor 202 from going into saturation. Typically the bias voltage to the base of transistor 202 is at least one diode voltage higher than the voltage at the emitter of the grounded base transistor 202. Diode voltages (the forward diode voltage drop of a diode) also known as diode voltage drops are known to be in the range of 0.7 volts, varying depending on the particular implementation.

Common-base amplifier 202 is configured to isolate an input photocurrent produced by, for example, a reverse-biased photodiode (typically sourced into the node labeled INPUT). This photocurrent is transmitted from the emitter of 202 to the collector of 202, and then converted to a voltage by the transresistance 210 connected in a negative feedback path including common-emitter amplifier 204, as buffered by a common-collector amplifier 206. The common-base input pre-amplifier 202 isolates input capacitive loads typical of photodiodes from the common-emitter gain stage 204, thereby making the circuit bandwidth insensitive to input capacitance variations.

Common-base pre-amplifier 202 is biased through a current mirror formed with transistor 212; each transistor (202 and 212) has identical bias resistors 214 and 216. Transistors 202 and 212 are matched devices. Therefore 202 accurately mirrors the bias current in 212 over process and temperature variations. The same process and temperature insensitivity of this circuit can be achieved by providing 202 and 212 as ratioed devices, in which case resistors 214 and 216 would have to be correspondingly ratioed. In practice resistor 214 also provides an ac-blocking function since its resistance value is much greater than the input resistance presented by the emitter of 202. Transistor 212 is biased from the positive power supply source Vcc by the PMOS transistor 218, which itself is biased as a current mirror formed with PMOS transistor 220 to have a drain current proportional to I1 received at terminal 222. This input current at 222 is variable with temperature, providing temperature insensitivity to circuit 200. The transistor 218 has an identical matched PMOS transistor 224 that is also mirrored off of the drain current of transistor 220. Since 218 and 224 have equal dimensions and source-to-gate voltages, their drain currents are the same over process and temperature variations. These two transistors 218 and 224 each form current sources (current I2 and current I3 as shown) and also isolate the current mirror formed by transistors 202 and 212 from variations in the power supply voltage Vcc. This provides the circuit 200 with temperature insensitivity. Also, although the circuit will operate well with any suitable applied voltage, this particular topology will function well with Vcc set at approximately 3.3 Volts. Because the current mirror transistors 218 and 224 separately bias the current mirror formed by transistors 202 and 212, the current I3; which is the drain current of transistor 224 is equal to current I4, the collector current of 202. Therefore, neglecting the base current of 204, I3 is equal to I4 such that equal currents flow into and out of this node (i.e. the common connection of the source of 224, the base of 204, the collector of 202 and the lower end of resistor 210). Accordingly, no bias current flows through the resistor 210. This reduces the voltage headroom requirement for this circuit since 210 has no associated voltage drop, and additionally makes its value independent of the circuit bias conditions, thereby allowing resistor 210 to be a free parameter to set the transimpedance gain and bandwidth formed around the feedback amplifier provided by transistors 204 and 206. Thus, for example, if the resistance of 210 is set at approximately 1,000 ohms, then the gain of the amplifier will be approximately 1,000.

AC ground is provided to the base of transistor 202 by capacitor 226. High frequency noise present on the power supply rail as shown connected to Vcc is isolated from the current mirror devices 218, 220 and 224 by capacitor 228.

Voltage gain for this TIA circuit 200 is provided by the common-emitter amplifier 204, biased with a PMOS active load 230; which in turn is biased by the current mirror device 220, making the drain current of 230 also proportional to I1. The drain-to-source voltage of 230 makes the common-emitter amplifier 204 insensitive to power supply voltage variations at Vcc. This insensitivity to power supply variations is achieved because device 230 is an active load, i.e. a current source with a very high source impedance. The bias point of transistor 204 is adjusted by resistor 232. Note that resistor 232 does not affect low frequency gain since it is small as compared to the drain impedance presented by transistor 230; and also resistor 232 is bypassed at high frequencies by capacitor 234. The voltage output at the collector of 204 is buffered from the feedback resistor 210 by the common-collector unity gain amplifier 206, and also buffered from external circuitry at the OUTPUT by the common-collector amplifier 208. The common-collector amplifiers 206 and 208 are biased by the Widler current source formed by transistors 232, 234 and 236 and by resistors 238, 240, and 242. The Widler current source, is biased by an external current I5. Resistors 244 and 246 are small value damping resistors.

As temperature increases during operation of the circuit 200, the intrinsic bandwidth of the common-base amplifier 202 and the common-emitter amplifier 204 decreases, thereby decreasing the bandwidth of the TIA circuit 200 in general. In accordance with one aspect of the invention, the temperature increase is compensated for by making the external bias current I1 directly proportional to temperature. The increased bias current as a function of temperature holds performance constant. Circuits for providing current that is directly proportional to temperature are well known in the art and therefore not separately described. In accordance with one particular aspect of the invention, by providing a current I1 that is directly proportional to the ambient temperature, the TIA bandwidth is controlled to less than 5% variation over a 100 degree Celsius temperature excursion. In the example shown in FIG. 2, the bias currents of 202 and 204 are scaled to the same I1 reference current, although they could be separately adjustable by providing a separate mirror device and proportional current.

In accordance with the described embodiments of the invention, photocurrent can be either pushed or pulled from the emitter of transistor 202. In other words, this topology is suitable for common-anode or common-cathode photodetectors. Furthermore, circuit 200 can be operated from negative or split voltage supplies as long as the voltage potential is decreasing from the node labeled Vcc to the node identified as ground.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by providing other configurations of transistors. These alternatives can be suitably selected depending upon the particular application or in consideration of any number of factors associated with the operation of the system. These and other changes or modifications are intended to be included within the scope of the present invention.

What is claimed is:

1. A transimpedance amplifier comprising:
    a preamplifier stage having a grounded base transistor with its emitter coupled to an input,
    a voltage amplifier stage having a common-emitter transistor with its base coupled to the collector of the grounded base transistor,
    an amplifier stage having a first common-collector transistor with its base coupled to the collector of the common-emitter transistor,
    an output buffer stage having a second common-collector transistor providing an output at its emitter and its base coupled to the collector of the common-emitter transistor, and
    a biasing circuit coupled to the grounded base transistor providing a bias voltage that prevents the grounded base transistor from going into saturation.

2. A transimpedance amplifier as in claim 1 wherein the biasing circuit comprises:
    a current mirror transistor having its base coupled to the base of the grounded base transistor.

3. A transimpedance amplifier as in claim 2 wherein said current mirror transistor and grounded base transistor are matched devices.

4. A transimpedance amplifier as in claim 3, further comprising:
    a first resistor connected between the emitter of the grounded base transistor and a common connection;
    a second resistor connected between the emitter of the current mirror transistor and said common connection;
    wherein said first and second resistors are matched devices.

5. A transimpedance amplifier as in claim 2, further comprising:
    a first resistor connected between the emitter of the grounded base transistor and a common connection;
    a second resistor connected between the emitter of the current mirror transistor and said common connection;
    wherein said first and second resistors are matched devices.

6. A transimpedance amplifier as in claim 1, further comprising
    a feedback path, said feedback path comprising:
        a resistor having one end connected to a common node formed by the collector of the grounded base transistor and the base of the common emitter transistor,
        said feedback path passing through said common emitter transistor to its collector and the base of the first common-collector transistor,
        said feedback path passing through said first common-collector transistor to its emitter, said emitter being connected to the other end of said resistor.

7. A transimpedance amplifier as in claim 1 further comprising:
    a first active load coupled to the collector of said common-emitter transistor.

8. A transimpedance amplifier as in claim 7 further comprising:
    a second active load coupled to the collector of said common-base transistor.

9. A transimpedance amplifier as in claim 8 wherein said first and second active loads are matched first and second devices.

10. A transimpedance amplifier as in claim 9 further comprising:
    a current mirror device forming a current source with said first and second active loads.

11. A transimpedance amplifier as in claim 8 wherein said first and second active loads are ratioed first and second devices.

12. A transimpedance amplifier as in claim 11 further comprising:
    a current mirror device forming a current source with said first and second active loads.

13. A transimpedance amplifier as in claim 10, wherein said current mirror device and said first and second active loads are MOS devices with their gate regions commonly connected and their drain regions commonly connected.

14. A transimpedance amplifier as in claim 10, further comprising:
    a bias current connected to said current mirror device, said bias current being proportional to the ambient temperature.

15. A transimpedance amplifier as in claim 1, wherein the collector of the common emitter transistor is coupled to the base of the second common-collector transistor by circuit elements comprising:
    a diode connected between the collector of said common emitter transistor and the base of said first common-collector transistor, and
    a conductive connection between the emitter of said first common-collector transistor and the base of said second common-collector transistor.

16. A transimpedance amplifier as in claim 1, wherein said biasing circuit comprises:
    a plurality of diodes connected to the base of the grounded base transistor.

17. A transimpedance amplifier as in claim 1, further comprising:
    a feedback path, said feedback path comprising:
        a resistor having one end connected to a common node formed by the collector of the grounded base transistor and the base of the common emitter transistor,
        said feedback path passing through said common emitter transistor to its collector,
        a diode coupling the collector of said common emitter transistor and the base of the first common-collector transistor,
        said feedback path passing through said first common-collector transistor to its emitter, said emitter being connected to the other end of said resistor.

* * * * *